US010775702B2

(12) United States Patent
Maitre et al.

(10) Patent No.: US 10,775,702 B2
(45) Date of Patent: Sep. 15, 2020

(54) OPTICAL LITHOGRAPHY PROCESS ADAPTED FOR A SAMPLE COMPRISING AT LEAST ONE FRAGILE LIGHT EMITTER

(71) Applicants: CENTRE NATIONAL DE LA RECHERCHE SCIENTIFIQUE, Paris (FR); SORBONNE UNIVERSITE, Paris (FR); UNIVERSITE PARIS DIDEROT—PARIS 7, Paris (FR)

(72) Inventors: Agnès Maitre, Paris (FR); Amit Raj Dhawan, Paris (FR); Pascale Senellart, Orsay (FR); Cherif Belacel, Paris (FR)

(73) Assignees: CENTRE NATIONAL DE LA RECHERCHE SCIENTIFIQUE, Paris (FR); SORBONNE UNIVERSITE, Paris (FR); UNIVERSITE DE PARIS, Paris (FR)

( * ) Notice: Subject to any disclaimer, the term of this patent is extended or adjusted under 35 U.S.C. 154(b) by 0 days.

(21) Appl. No.: 16/483,492

(22) PCT Filed: Feb. 12, 2018

(86) PCT No.: PCT/EP2018/053401
§ 371 (c)(1),
(2) Date: Aug. 5, 2019

(87) PCT Pub. No.: WO2018/149779
PCT Pub. Date: Aug. 23, 2018

(65) Prior Publication Data
US 2019/0369500 A1    Dec. 5, 2019

(30) Foreign Application Priority Data

Feb. 15, 2017 (EP) ..................................... 17305170

(51) Int. Cl.
*G03F 7/20*    (2006.01)

(52) U.S. Cl.
CPC .................. *G03F 7/70133* (2013.01)

(58) Field of Classification Search
CPC ...... G03F 7/20; G03F 7/0005; G03F 7/70133; G02B 6/138
(Continued)

(56) References Cited

U.S. PATENT DOCUMENTS 9,052,597 B2 * 6/2015 Schell .................... G02B 6/138
2013/0270596 A1 10/2013 Senellart et al.
(Continued)

FOREIGN PATENT DOCUMENTS

CN    104678716    6/2015

OTHER PUBLICATIONS

International Search Report, PCT/EP2018/053401, dated Jun. 11, 2018.
(Continued)

*Primary Examiner* — Hung Nguyen
(74) *Attorney, Agent, or Firm* — Nixon & Vanderhye

(57) ABSTRACT

Disclosed is a lithography process on a sample with at least one emitter, the process including: putting at least one layer of resist above the sample; exciting one selected emitter with light through the at least one layer of resist; detecting light emitted by the excited selected emitter and determining a position of the selected emitter; and curing with a light beam a part of the at least one layer of resist above the position of the selected emitter, the light beam being a shaped light beam having a cross-section, this cross-section having a central part, an intermediate part surrounding the central part and a border part surrounding the intermediate part, the intensity of the shaped light beam on the at least one layer of resist reaching a maximum at the intermediate part.

20 Claims, 5 Drawing Sheets

(58) Field of Classification Search
USPC .......................................................... 355/67
See application file for complete search history.

(56) References Cited

U.S. PATENT DOCUMENTS

2014/0302442 A1    10/2014  Schell et al.
2015/0036117 A1*   2/2015   Menon ................. G03F 7/0002
                                                355/72

OTHER PUBLICATIONS

Database EPODOC European Patent Office, The Hague, NL; Jun. 3, 2015 (Jun. 3, 2015), "Laser direct writing photolithographic system combined with single quantum dot locating function and method thereof", XP002772422, abstract & CN 104 678 716 A (Inst Semiconductors CAS) Jun. 3, 2015 (Jun. 3, 2015) figure 1.

Dousse A et al: "Controlled light-matter coupling for a single quantum dot embedded in a pillar microcavity using far-field optical lithography", Physical Review Letters, American Physical Society, US, vol. 101, No. 26, Dec. 31, 2008 (Dec. 31, 2008), pp. 267404-1-267404-4, XP002599443, ISSN: 0031-9007, 001: 10.1103/PHYSREVLETT.101.267404.

Dousse A et al:"Controlled light-matter coupling for a single quantum dot embedded in a pillar microactivity using far-field optical lithography", Physical Review Letters, American Physical Society, US, vol. 101, No. 26, Dec. 31, 2008 (Dec. 31, 2008), pp. 267404-1-267404-4, XP002599443, ISSN: 0031-9007,001: 10.1103/PHYSREVLETT.101.267404; The whole document.

* cited by examiner

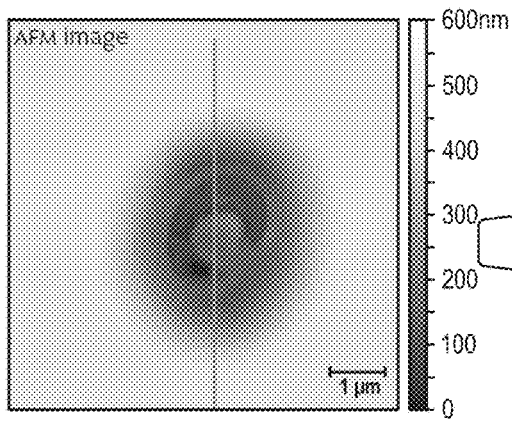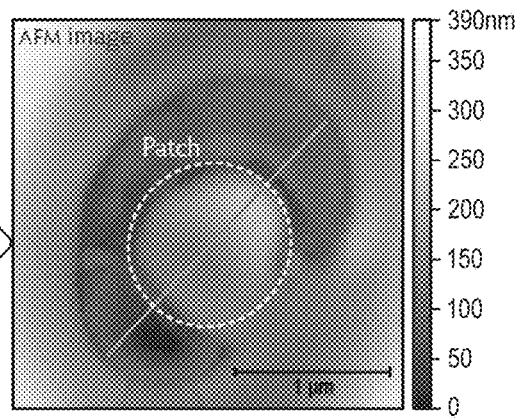
FIG. 5a   FIG. 5b
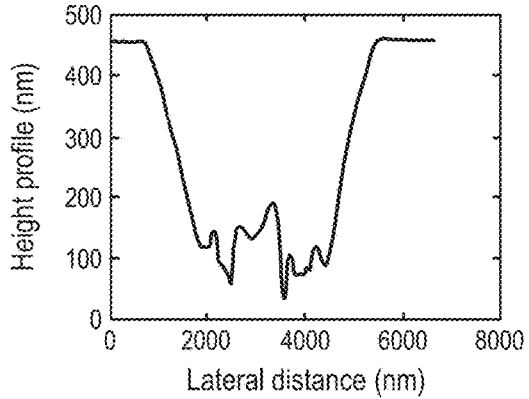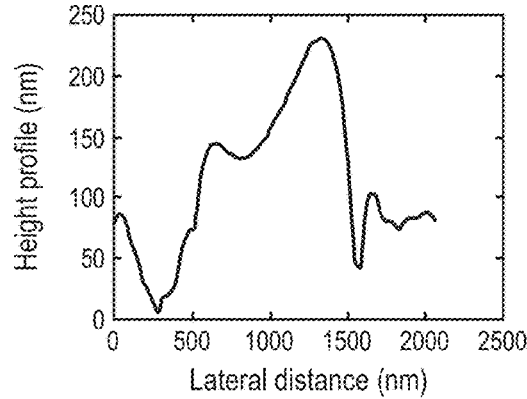
FIG. 5c   FIG. 5d
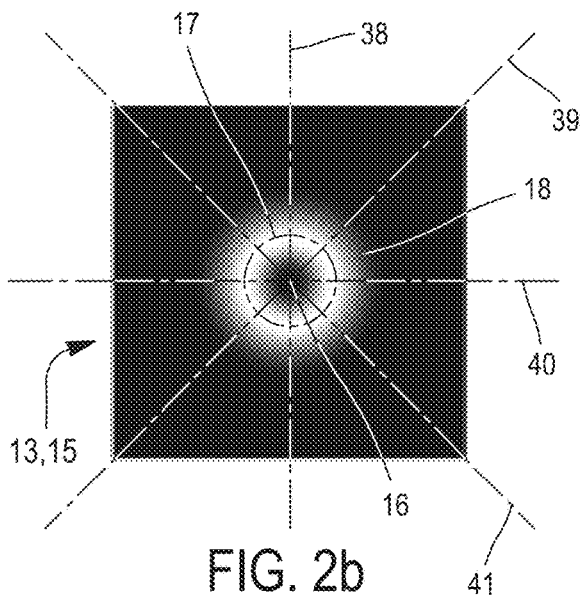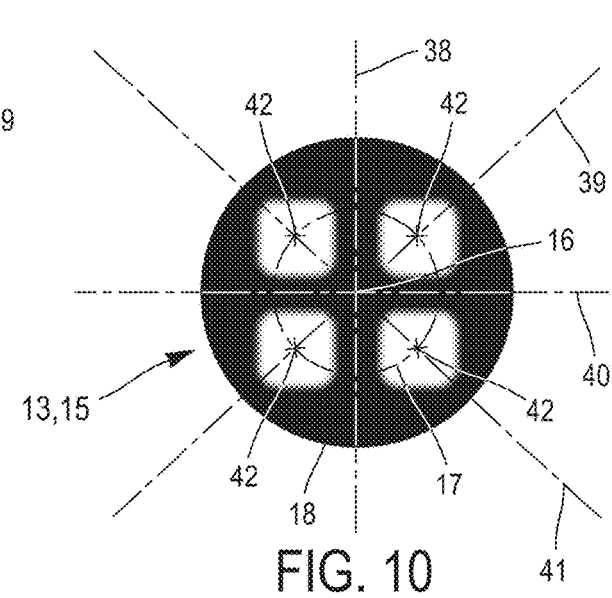
FIG. 2b   FIG. 10

OPTICAL LITHOGRAPHY PROCESS ADAPTED FOR A SAMPLE COMPRISING AT LEAST ONE FRAGILE LIGHT EMITTER

TECHNICAL FIELD

The present invention relates to a lithography process.

STATE OF THE ART

Photonic and plasmonic nanostructures within which individual (or aggregates) fluorescent nanoemitters like quantum dots, nitrogen vacancy centers in nanodiamonds, and fluorescent molecules are placed with nanometric precision find applications in many fields like single photon emission and plasmonics, and these structures serve as an ideal tool for investigating light-matter interactions at a single emitter level. The fabrication of such structures requires nanometric lateral and vertical control over placing the nanoemitter inside the structure. For this purpose, lithography has to be performed around nanoemitters, without destroying them. This task becomes very difficult when dealing with individual nanoemitters because an individual emitter is not as robust and bright as an aggregate of emitters.

It is very difficult to perform lithography on sensitive individual emitters like colloidal CdSe/CdS quantum dots, because the lithography has to be carried out right above the emitter but the laser intensity required to perform the lithography photobleaches and thus destroys the concerned emitter, thus making the process fail.

An object of this invention is to propose a lithography process that can be performed on fragile emitters (in particular individual or single emitters) with limited risks to photobleach or destroy the emitters compared to prior art.

SUMMARY OF THE INVENTION

An aspect of the invention concerns a lithography process on a sample comprising at least one emitter, said process comprising:
putting at least one layer of resist above the sample,
exciting one selected emitter with light (through the at least one layer of resist,
detecting light emitted by the excited selected emitter and determining a position of the selected emitter,
curing with a light beam a part of the at least one layer of resist by putting the light beam above the position of the selected emitter, the light beam being a shaped light beam having a cross-section, this cross-section having a central part, an intermediate part surrounding the central part and a border part surrounding the intermediate part, the intensity of the shaped light beam on the at least one layer of resist reaching a maximum at the intermediate part.

During the curing step, seen from above the sample, the intermediate part can be surrounding the selected emitter, and/or the shaped light beam can be centered on the position of the selected emitter.

The central part can be:
a center of rotational symmetry of the intensity of the shaped light beam, and/or
an intersection of at least two symmetry axis of reflection symmetry of the intensity of the shaped light beam.

The light for exciting the selected emitter can come from the same source than the shaped light beam. The light for exciting the selected emitter can be the shaped light beam, but not necessarily with the same light power.

The light for exciting the selected emitter can have a power lower than the power of the shaped light beam used for curing a part of the at least one layer of resist by putting the light beam above the position of the selected emitter. The light for exciting the selected emitter can have a power at least 1000 times lower than the power of the shaped light beam used for curing a part of the at least one layer of resist by putting the light beam above the position of the selected emitter.

The shaped light beam can be a spatially shaped laser mode. The shaped light beam can be:
different from a $TEM_{00}$ or $LG_{00}$ laser mode, and/or
a Laguerre-Gaussian mode or a Bessel beam, and/or
a donut Laguerre-Gaussian laser mode, and/or
a $LG_{l=1,\ p=0}$ or $LG_{l=2,\ p=0}$ or $LG_{l=1,\ p=1}$ or $LG_{l=4,\ p=0}$ Laguerre-Gaussian mode.

The intensity of the shaped light beam on the at least one layer of resist can reach a minimum at the central part.

The process according to the invention can further comprise, before the curing step, a step of selecting the selected emitter based on the detected light emitted by the selected emitter. The step of selecting the selected emitter can be based:
on a wavelength and/or
on a polarization and/or
on an intensity and/or
on bunched or antibunched emission characteristics
of the detected light emitted by the selected emitter and/or an estimated lifetime of the selected emitter.

The curing step can create a surrounding burnt above the position of the selected emitter. The process according to the invention can comprise, after the curing step, removing the part of the at least one layer of resist located inside the surrounding burnt, the surrounding burnt then becoming a hole located inside the at least one layer of resist and above the position of the selected emitter. The process according to the invention can comprise a step of depositing a metallic layer inside the hole (preferably in contact with the sample), above the position of the selected emitter.

The at least one layer of resist can comprise two layers of two different resists, the two layers comprising a first layer in contact with the sample and a second layer in contact with the first layer.

The at least one emitter can be comprised in the sample inside an emitter layer. The at least one emitter can be comprised in the sample between two layers of the same dielectric material forming the emitter layer. One first side of the emitter layer can be in contact with the at least one layer of resist, and/or one second side of the emitter layer can be in contact with a metallic layer or a Bragg mirror.

Each emitter can be a fluorescent emitter or a photoluminescent emitter.

Each emitter can be a quantum dot, a nitrogen vacancy center in a nanodiamond, a fluorescent molecule, or a defect in a monolayer two dimensional material (like $MoS_2$, $WSe_2$).

DETAILED DESCRIPTION OF THE FIGURES AND OF REALIZATION MODES OF THE INVENTION

Other advantages and characteristics of the invention will appear upon examination of the detailed description of embodiments which are in no way limitative, and of the appended drawings in which:

FIGS. 1(a) to 1(f) are side views of a sample 2 illustrating different steps of an embodiment of a process according to the invention which is a best realization mode; this embodiment is described in the particular case of manufacturing a plasmonic patch antenna FIG. 2a illustrates a part 21 of a device 8 for implementing the scanning and curing steps of the process of FIG. 1, this part 21 being arranged for creating a shaped light beam 15 (donut Laguerre-Gaussian laser mode) using a reflective phase-only spatial light modulator 26, for curing a resist layer 3, 4 above the sample 2, FIG. 2b illustrates the shaped light beam 15 obtained with the setup of FIG. 2a;

Figures 1A, 1B, 1C:
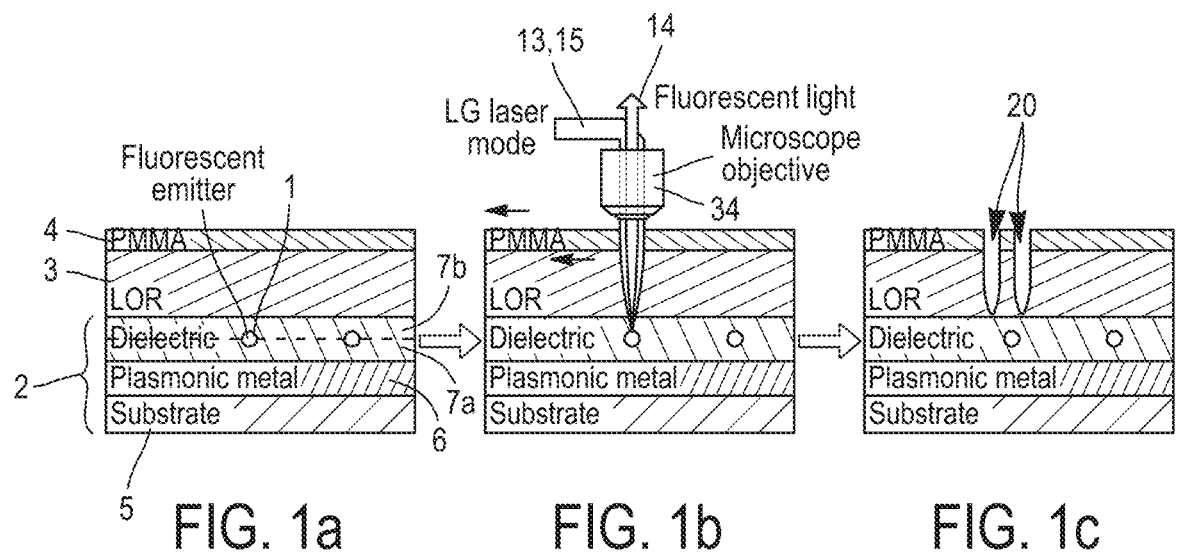
Figures 1D, 1E, 1F:
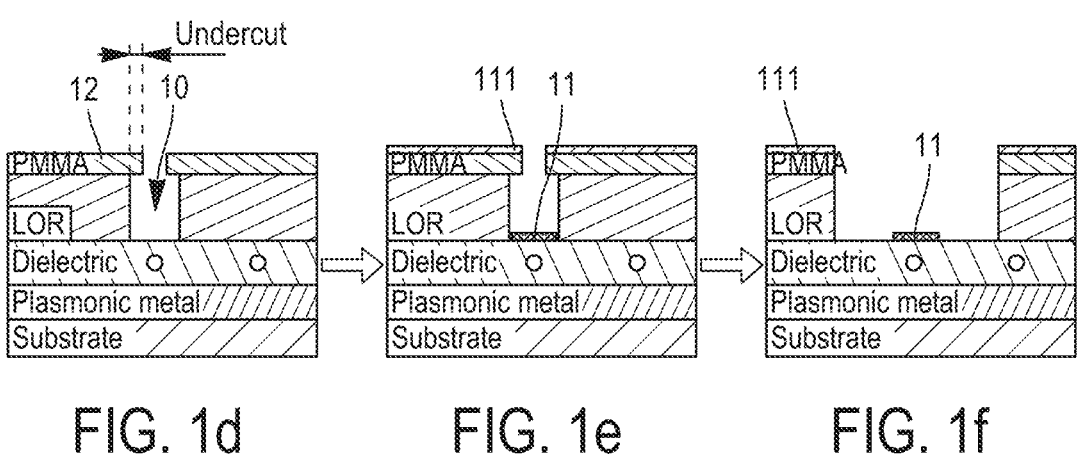
Figure 2A:
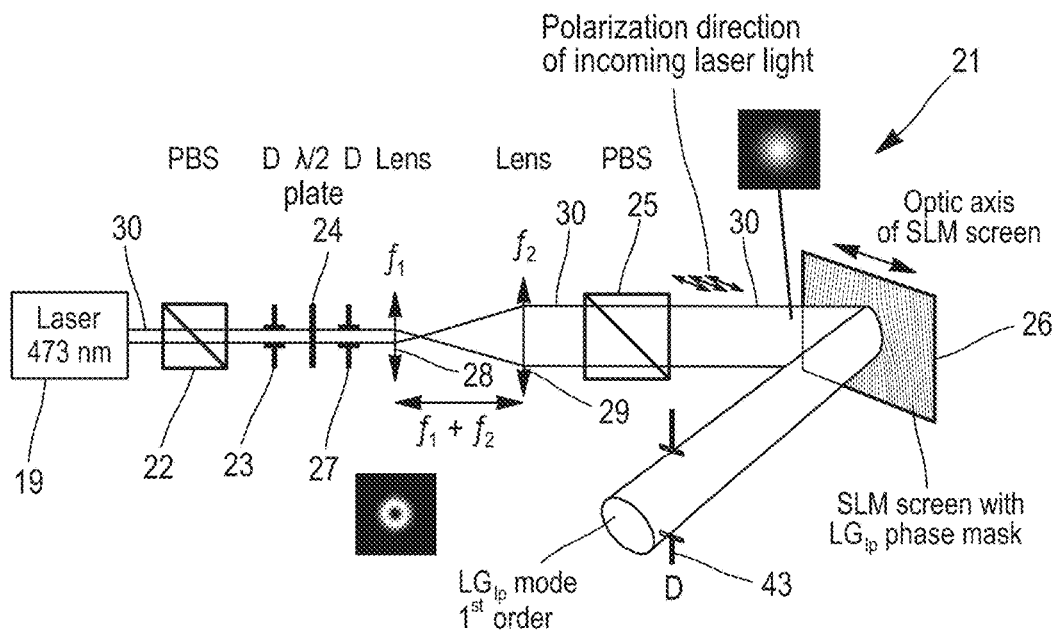
Figure 6:
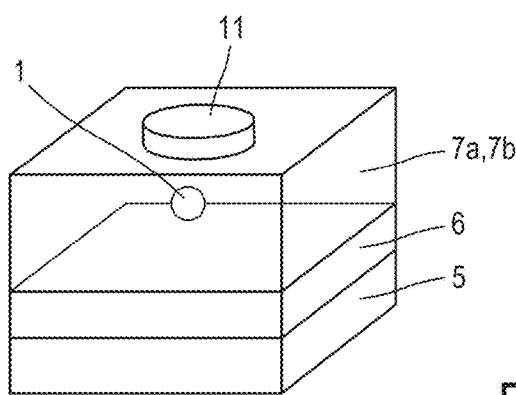
Figure 6:
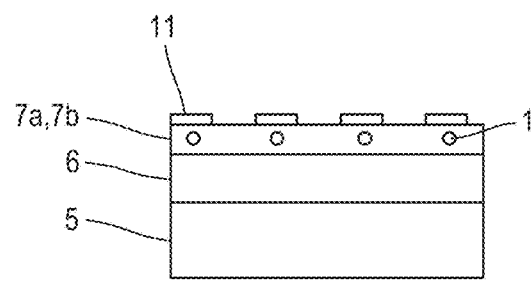
Figure 7:
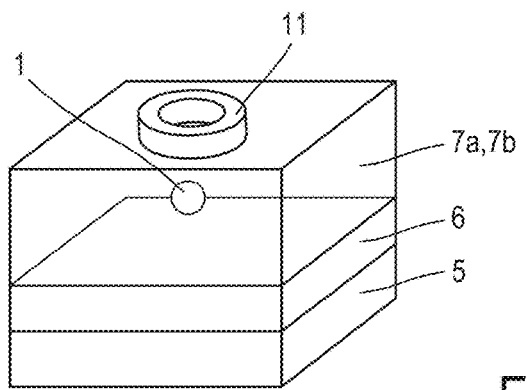
Figure 7:
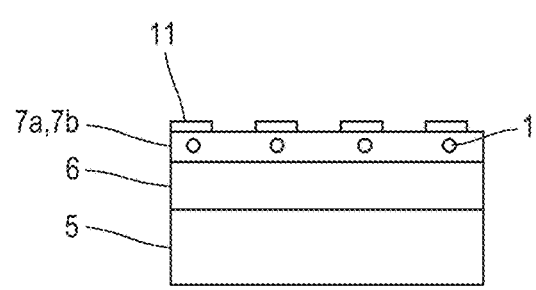
Figure 8:
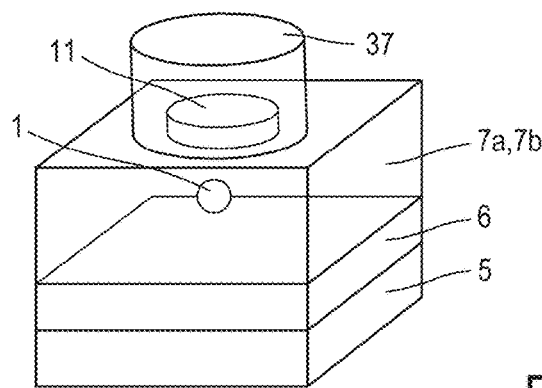
Figure 8:
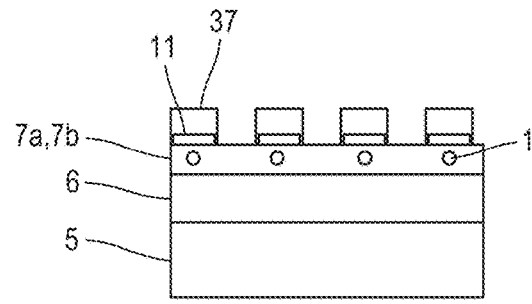
Figure 9:
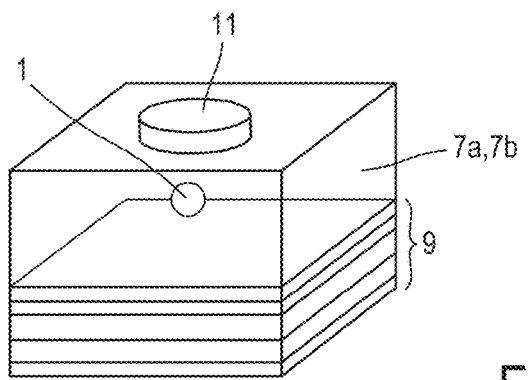
Figure 9:
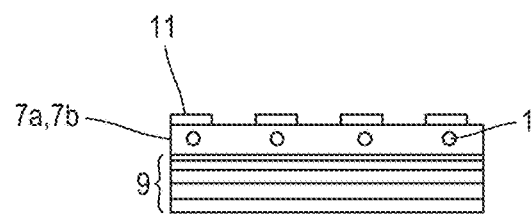

in FIG. 5:

FIG. 5(a) is an atomic force microscopy image of an antenna made using $LG_{l=2, p=0}$ lithography, corresponding to the step of FIG. 1(f); the corresponding height profile is given in FIG. 5(c);

FIG. 5(b) is a zoom of FIG. 5(a); the corresponding height profile is given in FIG. 5(d);

FIGS. 6 to 9 illustrate other structures that can be manufactured by the process according to the invention:

FIG. 6 is a partial perspective view (left) and a side view (right) of plasmonic patch antennas FIG. 7 is a partial perspective view (left) and a side view (right) of other plasmonic patch antennas FIG. 8 is a partial perspective view (left) and a side view (right) of metallo-dielectric antennas FIG. 9 is a partial perspective view (left) and a side view (right) of Tamm structures FIG. 10 illustrates a variant of the shaped light beam 15 obtained with the setup of FIG. 2a;

These embodiments being in no way limitative, we can consider variants of the invention including only a selection of characteristics subsequently described or illustrated, isolated from other described or illustrated characteristics (even if this selection is taken from a sentence containing these other characteristics), if this selection of characteristics is sufficient to give a technical advantage or to distinguish the invention over the state of the art. This selection includes at least one characteristic, preferably a functional characteristic without structural details, or with only a part of the structural details if that part is sufficient to give a technical advantage or to distinguish the invention over the state of the art.

We are now going to describe, in reference to FIGS. 1 to 5, an embodiment of a process according to the invention and a device for implementing this process embodiment according to the invention.

This lithography process embodiment according to the invention is implemented on a sample 2 comprising at least one emitter 1.

Each emitter is an individual emitter 1 (i.e. an emitter capable of emitting one single photon at a time) or an aggregate emitter 1 (formed by an assembly of a plurality of individual emitters 1). Each emitter 1 is preferably an individual emitter 1.

Each emitter is a nano-emitter, i.e. an emitter having a volume that can completely enter inside a sphere having a 100 nm diameter.

Each emitter 1 is something that emits light after absorbing photons. The absorbed photons can be optical, ultraviolet, infrared, or in general, from any part of the electromagnetic spectrum.

Each emitter 1 can be a fluorescent emitter or a photoluminescent emitter.

Each emitter 1 is typically a quantum dot, a nitrogen vacancy center in a nanodiamond, a fluorescent molecule, or a defect in a monolayer two dimensional material like $MoS_2$, $WSe_2$.

In the particular case of embodiment of FIGS. 4 and 5, each emitter 1 is a CdSe/CdS quantum dot, more precisely a CdSe/CdS core/shell colloidal quantum dot.

The at least one emitter 1 is comprised in the sample 2 inside an emitter layer 7a, 7b.

As illustrated in FIG. 1(a), the at least one emitter 1 is comprised in the sample between two layers 7a, 7b, preferably two layers 7a, 7b of the same dielectric material forming the emitter layer, typically PMMA (polymethyl methacrylate).

The sample 2 comprises an intermediate layer 6 comprised between a substrate 5 (typically a silicon wafer) and the emitter layer 7a, 7b. The intermediate layer 6 is a metallic layer 6. In the particular case of embodiment of FIGS. 4 and 5, gold (Au) was chosen as the plasmonic metal.

The sample 2 is prepared as follow:

on the wafer 5 (e.g., a silicon wafer), the optically thick layer 6 (~200 nm) of a plasmonic metal (e.g., gold or silver) is deposited by plasma vapor deposition.

then the layer of a dielectric material 7a is deposited (e.g., by spincoating) on it. The typical thickness of layer 7a is comprised between 0 nm and 200 nm.

then on top of the dielectric layer 7a, individual or multiple fluorescent emitters 1 (e.g., quantum dots, nitrogen vacancy centers in nanodiamonds, etc.) are spincoated.

then the other layer of a dielectric material 7b is deposited. The typical thickness of layer 7b is comprised between 0 nm and 200 nm. Finally we have a layer of a dielectric material 7a, 7b with embedded individual emitter 1 or multiple fluorescent emitters 1.

As illustrated in FIG. 1(a), the process embodiment according to the invention comprises the step of putting at least one layer 3, 4 of resist above the sample 2.

The at least one layer 3, 4 of resist comprises two layers of two different resists, the two layers comprising a first layer 3 (LOR) in contact with the sample 2 and a second (or top) layer 4 (PMMA) above (preferably in contact with) the first layer 3.

More precisely, above the dielectric layer 7a, 7b, a layer 3 of LOR® 5A resist (~500 nm in thickness) is spincoated and baked. LOR® 5A is a commercial lithography liftoff resist manufactured by MicroChem Corp.

Above the LOR® 5A layer 3, a 50 nm thick layer 4 of PMMA (polymethyl methacrylate) is spincoated and baked.

One first side of the emitter layer 7a, 7b is in contact with the at least one layer 3, 4 of resist.

One second side of the emitter layer 7a, 7b is in contact with the metallic layer 6.

Figure 3:
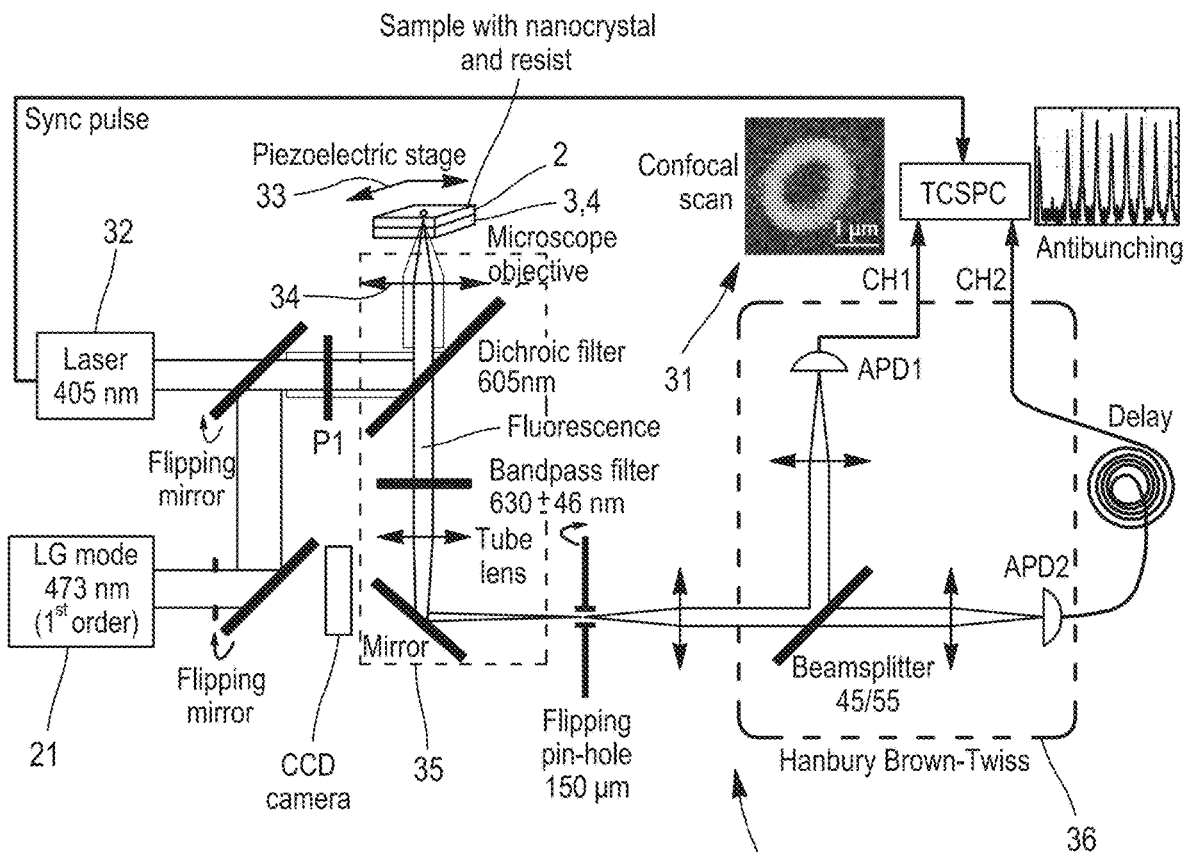
FIG. 3 illustrates the device 8 for implementing the scanning and curing steps of the process of FIG. 1, in FIG. 4.

FIG. 3 illustrates a device or optical setup 8 for implementing some steps of the process embodiment according to the invention.

Beam profiles which are circularly symmetric (or lasers with cavities that are cylindrically symmetric) are often best solved using the Laguerre-Gaussian modal decomposition $LG_{l,p}$. These functions are written in cylindrical coordinates using Laguerre polynomials. Each transverse mode $LG_{l,p}$ is again labelled using two integers, in this case the radial index $p≥0$ and the azimuthal index I which can be positive or negative or zero.

FIG. 2a illustrates the part 21 of the optical setup 8 used to modulate the phase of an incident laser beam 30 and generate other modes, such as LG and Bessel beams. The incident laser beam 30 of a 473 nm continuous wave diode laser 19 is sent through a polarizing beam splitter (PBS) cube 22, which selects only the s-polarization part of the laser. A diode laser is generally polarized and by letting it pass through a PBS 22, we enhance the polarization purity of the transmitted laser light. The beam 30 is spatially filtered by a diaphragm 23 and transmitted through a halfwave plate 24 (or retarder). This halfwave plate 24 and a following PBS 25 allow us to control the power of the laser beam incident on a spatial light modulator (SLM) screen 26. After passing through another diaphragm 27, the beam 30 passes through an assembly of two lenses 28, 29, which acts as a beam expander. Using lenses 28, 29 of focal lengths f1 and f2, respectively, we attain a beam expansion of f2/f1 (we use a 5× beam expander). The goal of beam expansion is to cover the entire screen of the SLM 26; it eases the alignment of the centers of the phase mask 26 and the incident laser beam 30 (which results in better modulation) and reduces the incident laser beam intensity on the SLM screen 26 (thus preventing damage to the liquid crystals). The expanded laser beam 30 passes through the PBS 25, through which only the s-polarization is transmitted. The transmitted light beam 30 is incident on the phase-only reflective SLM screen 26, which is connected to a computer and an $LG_{l,p}$ explicit phase mask (with an included binary blazed grating) is displayed on it. The direction of the optic axis of the SLM screen is almost parallel to the polarization of the incident beam. The resulting consists of the phase-modulated diffracted light (which includes several orders of the diffraction) and the zero-order or undiffracted light. The blazed grating separates the zero-order spot from the first order of the diffracted LG mode, and the diaphragm 43 spatially filters only the first order of diffraction. The selected first diffraction order 13, 15 can be propagated and aligned as required. For example $LG_{l=1,p=0}$, $LG_{l=1,p=0}$, and $LG_{l=4,p=0}$ have been used to perform lithography.

The sample 2 is put on a motorized (piezoelectric) stage 33 in front of an objective 34 of a microscope 35.

As illustrated in FIG. 1(b), the process embodiment according to the invention then comprises exciting steps comprising exciting one after the other a plurality of emitters 1 including one selected emitter 1, with light 13 through the at least one layer of resist 3,4. This excitation light 13 is the previously described selected first diffraction order.

Light 13 is also called excitation beam 13.

Light 13 is a spatially shaped laser mode.

Light 13 is a non fundamental Laguerre-Gaussian mode or a Bessel beam (different from a $LG_{l=0,p=0}$ laser mode or a fundamental transverse mode $TEM_{00}$), typically a donut Laguerre-Gaussian laser mode such like a $LG_{l=1,p=0}$ or $LG_{l=2,p=0}$ or $LG_{l=1,p=1}$ or $LG_{l=4,p=0}$ Laguerre-Gaussian mode.

As illustrated in FIG. 1(b), the process embodiment according to the invention also comprises detecting steps comprising detecting one after the other the light 14 emitted each excited emitter 1 including the selected emitter 1, and determining a position of each excited emitter 1 including the selected emitter 1.

The detected light 14 is fluorescence light.

The detected light 14 is collected, detected and analyzed thanks to a Hanbury Brown and Twiss setup 36.

The process embodiment according to the invention then comprises (before the following curing step), a step of selecting the selected emitter 1 among all the excited emitters 1, this selection being based on the detected light 14 emitted by the selected emitter 1.

The step of selecting the selected emitter 1 is based:
on a wavelength and/or
on a polarization and/or
on an intensity and/or
on bunched or antibunched emission characteristics,
of the detected light 14 emitted by the selected emitter 1 and/or an estimated lifetime of the selected emitter 1. This lifetime estimation can be based on time resolved fluorescence measurement.

The exciting steps and detecting steps are part of a scanning step. Sample 2 is scanned by confocal microscopy and the selected emitter 1 is selected as previously explained. The selected emitter 1 is scanned using the previously described donut Laguerre-Gaussian mode (170 nW and 473 nm continuous wave laser). FIG. 3 shows the optical setup 8 and a confocal scan image 31 of the selected emitter 1 made using the $LG_{l,p}$ laser mode. In this image 31, the donut shape is not perfectly circular mainly due to the large angle of reflection of the SLM screen, and then the mirrors used for guiding the LG mode into the microscope are not exactly at 45° to the incident light.

During this scan (comprising the exciting steps and detecting steps), light 13 is imaged and focused on the selected emitter 1.

During this scan (comprising the exciting steps and detecting steps), the relative position between the sample 2 and the light 13 is moved (thanks to the stage 33). In other words, the shape of light 13 is scanned by the fluorescent selected emitter 1. In other words, each imaged pixel of the scan image 31 corresponds to a specific relative position between the sample 2 and the excitation beam 13. The position of the selected emitter 1 is determined as being the relative position between the sample 2 and the beam 13, 15 obtained for imaging the pixel (in image 31) at the center of the donut or closed loop shape of beam 13, 15.

Before this construction of confocal scan image 31 using the $LG_{l,p}$ laser mode, another scanning is usually carried out using a fundamental mode of a 405 nm laser 32 operating at about 50 nW before entering the microscope 35 for making photon antibunching measurement and then confirming if it is the selected emitter 1 a single photon emitter 1.

As illustrated in FIG. 1(b), the process embodiment according to the invention then comprises curing with a light beam 15 a part of the at least one layer 3, 4 of resist by putting the light beam 15 above the position of the selected emitter 1.

Beam 15 is also called the curing beam 15.

This light beam 15 is the previously described selected first diffraction order.

The light beam 15 is shaped by the spatial light modulator 26.

As illustrated in FIG. 2b, the light beam 15 is a shaped light beam 15, and a cross section of this light beam 15 (in a plane perpendicular to the optical axis of objective 34 or perpendicular to an average direction of propagation of this beam 15 onto the at least one layer 3, 4 and/or onto the selected emitter 1), imaged (and focused) on the emitter 1, has:
- a central part 16), which is in this case:
  - a single point
  - a center of rotational symmetry of the intensity of light beam 15 in this cross section
  - an intersection of at least two (preferably at least four) symmetry axis 38, 39, 40, 41 of reflection symmetry of the intensity of light beam 15 in this cross section
- an intermediate part 17 surrounding the central part 16; this intermediate part 17 is a closed curve, preferably a circle; this intermediate part 17, from a front view of the sample 2 from the side of the at least one layer 3, 4 of resist (with a view direction parallel to the optical axis of objective 34 or parallel to an average direction of propagation of this beam 15 onto the at least one layer 3, 4 and/or onto the selected emitter 1), surrounds the selected emitter 1, and
- a border part 18 surrounding the intermediate part 17.

The intensity of the curing shaped light beam 15 on the at least one layer 3, 4 of resist reaches a maximum (compared to the central part 16 and the border part 18) at the intermediate part 17, and is even maximum (compared to the central part 16 and the border part 18) over all the intermediate part 17.

During the curing step, seen from above the sample 2 from the side of the at least one layer 3, 4 of resist, the intermediate part 17 is surrounding the selected emitter 1. The curing shaped light beam 15 is centered or substantially centered on the position of the selected emitter 1 (i.e. the central part 16 is right above the selected emitter 1).

The curing shaped light beam 15 is a spatially shaped laser mode.

The curing shaped light beam 15 is a non fundamental Laguerre-Gaussian mode or a Bessel beam (different from a $TEM_{00}$ or $LG_{l=0,\ p=0}$ laser mode), typically a donut Laguerre-Gaussian laser mode such like a $LG_{l=1,\ p=0}$ or $LG_{l=2,\ p=0}$ or $LG_{l=1,\ p=1}$ or $LG_{l=4,\ p=0}$ Laguerre-Gaussian mode.

The intensity of the curing shaped light beam 15 on the at least one layer 3, 4 of resist reach a minimum (compared to the intermediate part 17 and the border part 18) at the central part 16, this minimum intensity having a value at least one hundred times inferior to the value of the maximum intensity of the intermediate part 17. This minimum is preferably a zero intensity or a substantially zero intensity.

The light 13 for exciting the selected emitter 1 comes from the same source 19 than the curing shaped light beam 15.

The excitation beam 13 for exciting the selected emitter 1 is the same beam than the curing shaped light beam 15 (i.e. beams 13 and 15 have the same laser mode(s), the same shape, the same size(s)), except that preferably the excitation beam 13 and the curing light beam 15 do not have the same light power.

The light 13 for exciting the selected emitter 1 has a power lower than the power of the shaped light beam 15 used for curing a part of the at least one layer 3, 4 of resist by putting the light beam 15 above the position of the selected emitter 1. The light 13 for exciting the selected emitter 1 has a power at least 1000 times (preferably at least 10000 times) lower than the power of the shaped light beam 15 used for curing a part of the at least one layer 3, 4 of resist by putting the light beam 15 above the position of the selected emitter 1. Thus, the selected emitter 1 is located with a low power laser 13 and the resist 3, 4 on top of it is burned with a high power laser 15.

After positioning the selected emitter 1 at the center of the focused donut Laguerre-Gaussian laser mode, the 473 nm laser is blocked from entering into the microscope 35. After setting the power of the first order of the donut Laguerre-Gaussian mode to 7 mW, it is let into the microscope 35 for a duration of 90 s. In this time resist bi-layer 3, 4 above the selected emitter 1 is burned.

By generating and utilizing spatially shaped laser modes like donut laser modes, the invention circumvents the problem of emitter bleaching and performs optical lithography centered over a single or aggregates of fluorescent emitters 1 without causing any harm to the emitter 1. This is because the light intensity at the center of a donut laser mode is ideally zero, and during the lithography process embodiment according to the invention, the emitter 1 is placed at the center of the donut laser mode. The optical lithography is performed on the resist 3, 4 above the emitter 1. The lateral accuracy of positioning the emitter 1 inside the nanostructure is decided by the imaging optics (<50 nm easily possible), and the vertical accuracy depends on the deposition method (<3 nm can be achieved if spin-coating or physical vapor deposition techniques are used).

As compared to electron-beam lithography, which needs very specialized equipment and special conditions (e.g., the sample 2 has to be placed in vacuum), the optical lithography process according to the invention can be carried out on an optical table, using widely available optical microscopes, lasers, and spatial light modulators.

As illustrated in FIG. 1(c), the curing step creates a surrounding burnt 20 above the position of the selected emitter 1. The surrounding burnt 20, from the front view of the sample 2 from the side of the at least one layer 3, 4 of resist, surrounds the selected emitter 1.

The surrounding burnt can have a shape of ring, circle, ellipse, or any closed curve surrounding the selected emitter.

Figure 4A:
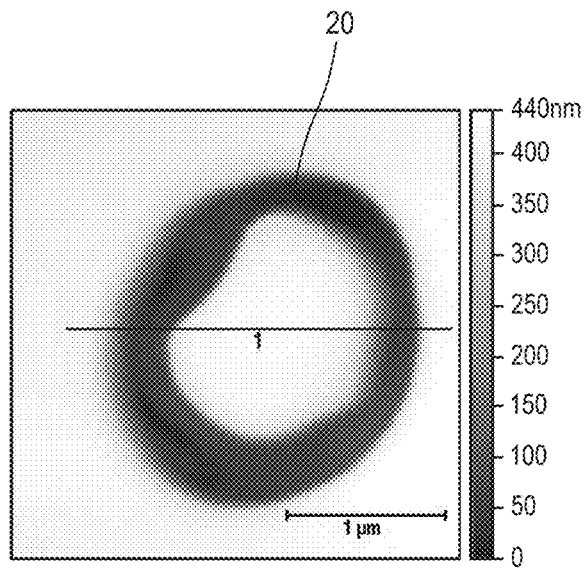
FIG. 4(a) is an atomic force microscopy image of a ring burnt 20 by a $LG_{l=4, p=0}$ mode into the resist bi-layer 3, 4 corresponding to the step of FIG. 1(c); the corresponding height profile is given in FIG. 4(c)
Figure 4B:
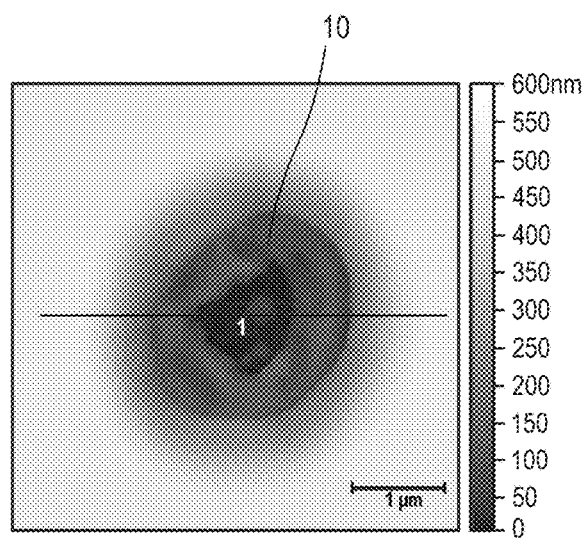
FIG. 4(b) is an atomic force microscopy image of a hole 10 corresponding to the step of FIG. 1(d); the corresponding height profile is given in FIG. 4(d)
Figure 4C:
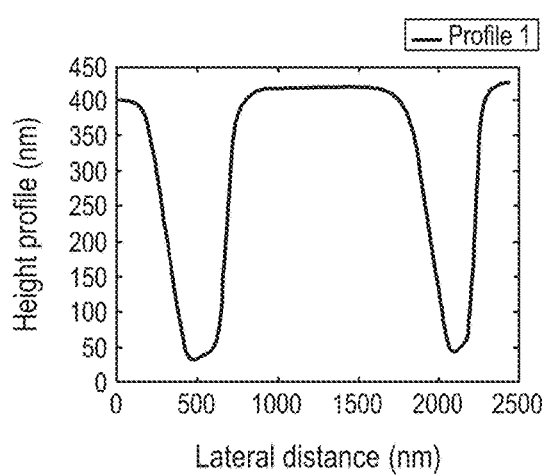

FIG. 4(a) is an atomic force microscopy image of a ring burnt 20 by a $LG_{l=4,\ p=0}$ mode into the resist bi-layer 3, 4 corresponding to the step of FIG. 1(c); the corresponding height profile is given in FIG. 4(c);

As illustrated in FIG. 1(d), the process embodiment according to the invention comprises, after the curing step, removing all the part of the at least one layer 3, 4 of resist located inside the surrounding burnt 20, the surrounding burnt 20 then becoming a hole 10 located inside the at least one layer 3, 4 of resist and above the position of the selected emitter 1. The sample 2 is immersed in a bath of Micorposit® MF®-319 solvent (this is a commercial developer made by Shipley Co.) for 3 to 5 s. MF-319 solvent, without attacking PMMA, develops LOR. It develops LOR® 5A and creates an undercut 12 in the PMMA layer 4 above it.

Figure 4D:
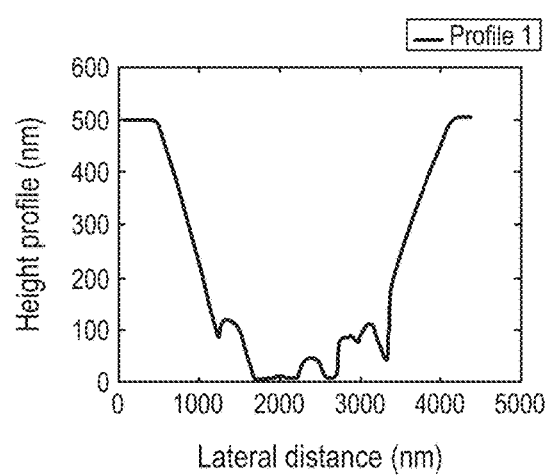

FIG. 4(b) is an atomic force microscopy image of the hole 10 corresponding to the step of FIG. 1(d); the corresponding height profile is given in FIG. 4(d);

As illustrated in FIG. 1(e), the process embodiment according to the invention then comprises a step of depositing a metallic layer 11 (or "patch" 11) inside the hole 10, in contact with the sample 2 and above the position of the selected emitter 1. The plasmonic metal (gold) for the patch 11 and film 111 is deposited by physical vapor deposition. The typical thickness of patch 11 is comprised between 5 nm and 50 nm.

The sample 2 is then immersed inverted and shaken in a bath of MF® 319 for about 50 s to perform the liftoff as shown in FIG. 1(f). This procedure removes LOR® 5A layer 3, PMMA layer 4 and plasmonic metal film 111 from the vicinity of the plasmonic metal patch 11, thus resulting in a plasmonic metal patch antenna. Thus, as illustrated by FIG.

1(f), resist layer 3 (LOR) is partially removed by MF-319; due to the corresponding part of layer 4 (PMMA) and the plasmonic metal film 111 above it are removed too. The plasmonic single emitter nanoantenna is ready.

FIG. 5(a) is an atomic force microscopy image of an antenna made using $LG_{l=2, p=0}$ lithography, corresponding to the step of FIG. 1(f); the corresponding height profile is given in FIG. 5(c).

FIG. 5(b) is a zoom of FIG. 5(a); the corresponding height profile is given in FIG. 5(d).

The invention allows selecting any emitter(s) 1 [fragile or robust, single or aggregates] from randomly distributed emitters 1 and perform lithography above them. Though in the FIGS. 1(a) to 1(f) the emitters 1 seem to aligned, but these emitters can be randomly oriented as well.

The invention works at room temperature.

The invention works also at low temperature.

Of course, the invention is not limited to the examples which have just been described and numerous amendments can be made to these examples without exceeding the scope of the invention.

The invention is not limited to the fabrication of the antenna of FIG. 1(f).

The invention can be used to fabricate a variety of photonic structures that use single or multiple fluorescent emitters 1 like quantum dots, nitrogen vacancy centers in nanodiamonds, etc. Examples of such photonic structures are single emitter plasmonic patch antennas, metallo-dielectric antennas, Tamm structures, etc. The precision of the technique can be mainly improved by the generation of better quality Laguerre-Gaussian modes (by better calibration of the SLM 26) and by using more optimized optics (higher numerical aperture microscope objective 34 and better sample motion stage 33).

The following fields/devices would benefit from this invention:

1) Any single emitter device which requires controlled and optimal positioning of the emitter inside the device.

2) Single emitter light emitting devices, which include promising single photon sources and entangled photons sources for quantum information.

3) Single photon detectors, and detectors of photon states.

4) Microlaser with a set of emitters optimally coupled to a cavity.

5) A variety of nanostructured devices that require accurate nanometric positioning of sensitive and low luminescence emitters (e.g., colloidal quantum dot, a nitrogen vacancy center in a nanodiamond, a fluorescent molecule, a defect in a monolayer two dimensional material like MoS2, WSe2, etc . . . ).

In different variants that can be combined:
- as illustrated in FIG. 6, the process according to the invention can fabricate a plurality of antennas on the same sample 2; and/or
- as illustrated in FIG. 7, layer 11 can be deposed in ring 20 between the steps of FIGS. 1(c) and 1(d) (before removing LOR® 5A layer 3 in the bath of MF® 319); this allows creating a metallic ring surrounding (from a top view) the selected emitter 1; and/or
- as illustrated in FIG. 8, the process according to the invention can comprise a step of depositing a dielectric layer 37 above and in contact with the metallic layer 11, preferably encapsulating layer 11 of each antenna, in order to obtain a least one metallo-dielectric antenna; To place a dielectric cap 37 on each patch 11, the lithography is performed two times: first for placing the patch 11 and then for placing the dielectric cap 37 on the patch 11; and/or
- as illustrated in FIG. 9, layer 6 of sample 2 is not necessary metallic and can be absent or can be replaced for example by a Bragg mirror 9 in order to obtain a least one Tamm structure; and/or
- It is not necessary that the light 13 used for scanning (observing) the emitter 1 and the light 15 used for curing the resist 3, 4 comes from the same light source 19. It is possible to use two aligned laser beams, e.g., firstly, a regular LG00 or TEM00 laser mode 13 at some wavelength (which excites the emitter 1 because the emitter absorbs this wavelength) is used to scan the emitter 1, and then another laser beam 15 (with a special shape, preferably a donut non fundamental Laguerre-Gaussian such like $LG_{l=1, p=0}$ or $LG_{l=2, p=0}$ or $LG_{l=1, p=1}$ or $LG_{l=4, p=0}$) is used to cure the resist 3, 4 by putting the light beam 15 above the emitter 1 (the emission wavelength of the laser is decided by the absorption of the resist 3, 4); in this case, a limitation concerning the relative laser intensity settings between beam 13 and beam 15 is not necessary: imagine that an emitter 1 absorbs at 1064 nm but the resist 3, 4 does not absorb this wavelength (the resist 3, 4 absorbs say at 300 nm or lower), then we would use a laser 13 at 1064 nm for exciting the emitter 1 and the power of this laser 13 can be higher than power of the laser 15 at 300 nm because at 1064 nm, the emitter 1 is excited but the resist 3, 4 is not cured. Whereas, at a lower power at 300 nm, the resist 3, 4 is cured; and/or
- in the fabricated structures, the thicknesses of the resists 3, 4, substrate 5, metal film 6, dielectric layer 7a, 7b, and the patch 11 can be modified as required. The same applies to the materials and shapes as well; and/or
- the patch 11 above the emitter 1 can be any plasmonic metal like Au, Ag, Al, Pt, etc. or some other novel material; and/or
- curing beam 15 is not necessary centered on the selected emitter 1, especially for fabricating a structure having patch 11 not centered on the selected emitter 1; and/or
- layer 11 can be a non-metallic and/or semiconductor and/or dielectric layer 11; and/or
- the selected emitter 1 excited by light 13 can at the same time excite two or more emitters which are in proximity; and/or
- layer 7a or layer 7b or both layers 7a, 7b together can be absent, in the case of a emitter 1 which is placed directly on layer 5 or 6; and/or
- the set of possible emitters 1 includes many more possibilities than a quantum dot, a nitrogen vacancy center in a nanodiamond, or a fluorescent molecule; and/or
- It is not necessary to remove all the remaining thickness of the lower layer 3 of resist above the position of the selected emitter 1. For example, to increase the vertical distance of the metallic patch 11 above the selected emitter 1, we can leave some part of layer 3 above the emitter 1; and/or
- It is possible to sandwiching the emitter(s) 1 between a layer 7a (for example of SiO2) and a layer 7b (for example of PMMA), without the layers 5, 6; and/or
- in a variant to donut laser modes, spatial light modulation by modulator 26 can be used to generate several other specialized laser modes (e.g., squares, lattices, multiple rings, etc.). These modes can then be focused through the microscope objective 34 to perform optical lithography and fabricate specialized nanostructures; the shape of light 13 and/or beam 15 can be more complex; FIG. 10 illustrates a variant a the shaped beam 13, 15: in this variant only described for its differences form the beam 13, 15 of FIG. 2*b*:
- there is no rotational symmetry, and central part 16 is not a center of rotational symmetry of the intensity of beam 13, 15,
- the intensity of the shaped light beam 13, 15 on the at least one layer 3, 4 of resist is not maximum (compared to the central part 16 and the border part 18) over all the intermediate part 17, but only reaches a maximum (compared to the central part 16 and the border part 18) at four points 42 of the intermediate part 17.

Of course, the different characteristics, forms, variants and embodiments of the invention can be combined with each other in various combinations to the extent that they are not incompatible or mutually exclusive. In particular all variants and embodiments described above can be combined with each other.

The invention claimed is:

1. Lithography process on a sample (2) comprising at least one emitter (1), said process comprising:
   putting at least one layer (3, 4) of resist above the sample (2),
   exciting one selected emitter (1) with light (13) through the at least one layer of resist (3,4),
   detecting light (14) emitted by the excited selected emitter (1) and determining a position of the selected emitter (1),
   curing with a light beam (15) a part of the at least one layer (3, 4) of resist by putting the light beam (15) above the position of the selected emitter (1), the light beam (15) being a shaped light beam (15) having a cross-section, this cross-section having a central part (16), an intermediate part (17) surrounding the central part (16) and a border part (18) surrounding the intermediate part (17), the intensity of the shaped light beam (15) on the at least one layer (3, 4) of resist reaching a maximum at the intermediate part (17).

2. Process according to claim 1, wherein during the curing step, seen from above the sample, the intermediate part is surrounding the selected emitter, and/or the shaped light beam (15) is centered on the position of the selected emitter (1).

3. Process according to claim 1, wherein the central part (16) is:
   a center of rotational symmetry of the intensity of the shaped light beam (15), and/or
   an intersection of at least two symmetry axis (38, 39, 40, 41) of reflection symmetry of the intensity of the shaped light beam (15).

4. Process according to claim 1, wherein the light (13) for exciting the selected emitter (1) and the light for the shaped light beam (15) come from a same light source (19).

5. Process according to claim 4, wherein the light (13) for exciting the selected emitter (1) is the shaped light beam (15).

6. Process according to claim 1, wherein the light (13) for exciting the selected emitter (1) has a power lower than the power of the shaped light beam (15) used for curing a part of the at least one layer (3, 4) of resist by putting the light beam (15) above the position of the selected emitter.

7. Process according to claim 6, wherein the light (13) for exciting the selected emitter (1) has a power at least 1000 times lower than the power of the shaped light beam (15) used for curing a part of the at least one layer (3, 4) of resist by putting the light beam (15) above the position of the selected emitter.

8. Process according to claim 1, wherein the shaped light beam (15) is a spatially shaped laser mode.

9. Process according to claim 8, wherein the shaped light beam (15) is:
   different from a $TEM_{00}$ or $LG_{00}$ laser mode, and/or
   a Laguerre-Gaussian mode or a Bessel beam, and/or
   a donut Laguerre-Gaussian laser mode, and/or
   a $LG_{l=1,\ p=0}$ or $LG_{l=2,\ p=0}$ or $LG_{l=1,\ p=1}$ or $LG_{l=4,\ p=0}$ Laguerre-Gaussian mode,
   wherein TEM signifies Transverse Electromagnetic Mode and LG signifies Laguerre-Gaussian.

10. Process according to claim 1, wherein the intensity of the shaped light beam (15) on the at least one layer (3, 4) of resist reach a minimum at the central part (16).

11. Process according to claim 1, further comprising, before the curing step, a step of selecting the selected emitter (1) based on the detected light (14) emitted by the selected emitter (1).

12. Process according to claim 11, wherein the step of selecting the selected emitter (1) is based:
   on a wavelength and/or
   on a polarization and/or
   on an intensity and/or
   on bunched or antibunched emission characteristics of the detected light (14) emitted by the selected emitter (1) and/or an estimated lifetime of the selected emitter (1).

13. Process according to claim 1, wherein the curing step creates a surrounding burnt (20) above the position of the selected emitter (1), the process comprising, after the curing step, removing the part of the at least one layer (3, 4) of resist located inside the surrounding burnt (20), the surrounding burnt (20) then becoming a hole (10) located inside the at least one layer (3, 4) of resist and above the position of the selected emitter (1).

14. Process according to claim 13, further comprising a step of depositing a metallic layer (11) inside the hole (10), above the position of the selected emitter (1).

15. Process according to claim 1, wherein the at least one layer (3, 4) of resist comprises two layers of two different resists, the two layers comprising a first layer (3) in contact with the sample (2) and a second layer (4) in contact with the first layer (3).

16. Process according to claim 1, wherein the at least one emitter (1) is comprised in the sample inside an emitter layer (7*a*, 7*b*).

17. Process according to claim 16, wherein the at least one emitter (1) is comprised in the sample between two layers (7*a*, 7*b*) of the same dielectric material forming the emitter layer.

18. Process according to claim 16, wherein:
   one first side of the emitter layer (7*a*, 7*b*) is in contact with the at least one layer (3, 4) of resist, and
   one second side of the emitter layer (7*a*, 7*b*) is in contact with a metallic layer (6) or a Bragg mirror.

19. Process according to claim 1, wherein each emitter (1) is a quantum dot, a nitrogen vacancy center in a nanodiamond, or a fluorescent molecule.

20. Process according to claim 2, wherein the central part (16) is:
   a center of rotational symmetry of the intensity of the shaped light beam (15), and/or an intersection of at least two symmetry axis (38, 39, 40, 41) of reflection symmetry of the intensity of the shaped light beam (15).

* * * * *